United States Patent
Lu et al.

(10) Patent No.: US 10,514,407 B2
(45) Date of Patent: Dec. 24, 2019

(54) DISTRIBUTED TEST METHOD APPLICABLE TO SYSTEM-LEVEL TEST OF INTELLIGENT HIGH VOLTAGE EQUIPMENT

(71) Applicants: XJ GROUP CORPORATION, Xuchang, Henan (CN); XJ ELECTRIC CO., LTD, Xuchang, Henan (CN); Xuchang XJ Software Technology Co., Ltd, Xuchang, Henan (CN); State Grid Corporation of China, Beijing (CN)

(72) Inventors: Guanghui Lu, Xuchang (CN); Shuibin Zhou, Xuchang (CN); Xiaoshi Kou, Xuchang (CN); Qiang Gao, Xuchang (CN); Manling Dong, Xuchang (CN); Guohui Zeng, Xuchang (CN); Mingchao Yong, Xuchang (CN); Jiqing Mu, Xuchang (CN); Wusheng Lan, Xuchang (CN); Weijie Wang, Xuchang (CN); Lei Chen, Xuchang (CN)

(73) Assignees: XJ GROUP CORPORATION, Xuchang, Henan (CN); XJ ELECTRIC CO., LTD., Xuchang, Henan (CN); XUCHANG XJ SOFTWARE TECHNOLOGY CO., LTD., Xuchang, Henan (CN); STATE GRID CORPORATION OF CHINA, Beijing (CN)

( * ) Notice: Subject to any disclaimer, the term of this patent is extended or adjusted under 35 U.S.C. 154(b) by 620 days.

(21) Appl. No.: 15/273,343

(22) Filed: Sep. 22, 2016

(65) Prior Publication Data
US 2017/0082670 A1    Mar. 23, 2017

(30) Foreign Application Priority Data
Sep. 22, 2015 (CN) .......................... 2015 1 0608274

(51) Int. Cl.
*G01R 31/00* (2006.01)
*G01R 31/28* (2006.01)
(Continued)

(52) U.S. Cl.
CPC ......... *G01R 31/00* (2013.01); *G01R 31/2834* (2013.01); *G01R 31/31907* (2013.01);
(Continued)

(58) Field of Classification Search
None
See application file for complete search history.

(56) References Cited

U.S. PATENT DOCUMENTS

| 2015/0120270 A1* | 4/2015 | Hwang | G06Q 50/06 703/18 |
| 2016/0003921 A1* | 1/2016 | Hensler | G01R 31/3272 324/764.01 |

FOREIGN PATENT DOCUMENTS

| CN | 101236494 A | 8/2008 |
| CN | 101252471 A | 8/2008 |

(Continued)

OTHER PUBLICATIONS

Research on Test Case of Design Method based on Scenario mailed on Dec. 31, 2011.
(Continued)

*Primary Examiner* — John C Kuan
(74) *Attorney, Agent, or Firm* — Syncoda LLC; Feng Ma

(57) ABSTRACT

A distributed test method applicable to a system-level test of intelligent high voltage equipment. The method includes: firstly, carrying out unified modeling on test equipment behaviors according to test requirements, and generating a general test case for ensuring accuracy and coordination of test behaviors and test time sequences under various work conditions; then, extracting, according to a feature element
(Continued)

of role defining, sequence states of same roles from the general test case, and recombining the sequence states according to an execution sequence so as to form test sub-cases of the roles; finally, executing, by each piece of test equipment, corresponding test sub-cases to achieve cooperative linkage by means of information interaction, so as to accomplish entire process simulation of the test conditions.

8 Claims, 3 Drawing Sheets

(51) Int. Cl.
    *H02J 3/00*       (2006.01)
    *G01R 31/327*    (2006.01)
    *G01R 31/333*    (2006.01)
    *G01R 31/319*    (2006.01)

(52) U.S. Cl.
    CPC ........ *G01R 31/3271* (2013.01); *G01R 31/333* (2013.01); *H02J 2003/007* (2013.01); *Y04S 40/16* (2013.01)

(56) References Cited

FOREIGN PATENT DOCUMENTS

| CN | 101866316 A | | 10/2010 | |
|---|---|---|---|---|
| CN | 102141962 A | | 8/2011 | |
| CN | 102156673 A | | 8/2011 | |
| CN | 103455425 A | | 12/2013 | |
| CN | 103746882 A | * | 4/2014 | ............. H04L 43/50 |
| CN | 103885438 A | * | 6/2014 | |
| CN | 104007365 A | * | 8/2014 | |
| CN | 104020762 A | * | 9/2014 | |
| CN | 104516811 A | * | 4/2015 | |
| CN | 104569688 A | * | 4/2015 | |

OTHER PUBLICATIONS

Study on the Universal Test Cases of Distribution Automation System mailed on Apr. 30, 2015.

\* cited by examiner

DISTRIBUTED TEST METHOD APPLICABLE TO SYSTEM-LEVEL TEST OF INTELLIGENT HIGH VOLTAGE EQUIPMENT

The present patent application claims the priority of Chinese patent application No. 201510608274.3, entitled "Distributed test method applicable to system-level test of intelligent high voltage equipment" submitted on Sep. 22, 2015, by Applicants XJ GROUP CORPORATION, et al. The whole text of the present application is incorporated by reference in the present application.

TECHNICAL FIELD

The present disclosure relates to a distributed test method applicable to a system-level test of intelligent high voltage equipment, and belongs to the technical field of intelligent substation systems.

BACKGROUND

Intelligence of high voltage equipment is one of important items about intelligent power grid construction, and entire-life-cycle management of the high voltage equipment and optimized running of the power grid are achieved by means of functions such as state sensing, risk assessment, intelligent control and optimized regulation of the high voltage equipment. In order to ensure reliable running of intelligent high voltage equipment, it is necessary to carry out various tests on basic functions, performance indexes and the like at the stage of product design, delivery inspection or field installation. Because a system-level test of the intelligent high voltage equipment covers a plurality of pieces of equipment including a sensor layer, a spacer layer and a station control layer and integral function of the above pieces of equipment based on network interaction and mutual cooperation, this test is complex, and highly requires relevant work conditions and time sequences. At present, in actual engineering, due to limits of field conditions, only a single equipment-level test is carried out, continuous work condition simulation required by the system-level test is accomplished by manual cooperation, and system performances are manually evaluated. Therefore, the problems of high requirement on staffs, high time consumption, test incompleteness, low test efficiency and the like have been exposed.

SUMMARY

The present disclosure aims to provide a distributed test method applicable to a system-level test of intelligent high voltage equipment, to solve the problems of difficult operation and low efficiency during debugging test of intelligent high voltage equipment at present.

To solve the above technical problem, the present disclosure provides a distributed test method applicable to a system-level test of intelligent high voltage equipment. The test method includes the following steps:

1) carrying out unified modeling on test equipment behaviors according to test requirements, and generating a general test case;

2) extracting basic elements associated with sequence states of same roles in the general test case, and recombining the basic elements according to an execution sequence so as to form test sub-cases of the roles;

3) executing, by each piece of test equipment, corresponding test sub-cases after a test is started, and achieving cooperative linkage by means of information interaction, so as to accomplish an entire process of test conditions.

The general test case in Step 1) globally carries out systematic description and normalized expression on behaviors and time sequences required by system work conditions, corresponding action subjects being determined in different processes of the general test case.

The unified modeling refers to systematically ensuring accuracy and coordination of test behaviors and test time sequences under various work conditions, and the basic elements contained in an established model include state time sequences, test work conditions, equipment behavior associations, sequence conversion modes and role definitions.

The roles refer to the action subjects in different processes of the general test case, namely the test equipment.

When each piece of test equipment executes the corresponding test sub-cases, an analog quantity or a switch quantity is correspondingly output according to a pre-set time sequence so as to achieve simulation of high voltage equipment work conditions and test equipment environments.

When each piece of test equipment executes the corresponding test sub-cases, output information about tested equipment and interaction information about other testers are collected in real time, and execution of the next work condition or skipping of relevant work conditions in a test sequence is carried out according to the interaction information.

The test method further includes: collecting, analyzing and evaluating, by each piece of test equipment, action feedback and data information in a test process, so as to automatically accomplish function verification and performance detection of the tested equipment.

The present disclosure has the beneficial effects as follows. In the present disclosure, firstly, unified modeling is carried out on test equipment behaviors according to test requirements, and a general test case is generated for ensuring accuracy and coordination of test behaviors and test time sequences under various work conditions; then, according to a characteristic element of role definition, for each of same roles in the general test case, sequence states of the same role are extracted from the general test case, and are recombined according to an execution sequence so as to form test sub-case of the role; finally, each piece of test equipment executes corresponding test sub-case to achieve cooperative linkage by means of information interaction, so as to accomplish entire process simulation of the test conditions. The present disclosure is simple to achieve and reliable, can automatically meet system-level test requirements of intelligent high voltage equipment, is good in openness, and can improve the efficiency and accuracy of a complex system-level test; meantime, representative test cases established in the above process can be solidified, such that the reusability and the flexibility are improved, and a popularization and application prospect is wide.

DETAILED DESCRIPTION

The specific implementation of the present disclosure will be further illustrated below in conjunction with the drawings.

To overcome the defects of a system test on intelligent high voltage equipment in current engineering application, the present disclosure provides a distributed test method applicable to a system-level test of intelligent high voltage equipment. The method includes: firstly, carrying out unified modeling on test equipment behaviors according to test requirements, and generating a general test case for ensuring accuracy and coordination of test behaviors and test time sequences under various work conditions; then, for each of same roles in the general test case, extracting, according to a characteristic element of role definition, sequence states of the same role from the general test case, and recombining the sequence states according to an execution sequence so as to form a test sub-case of the role; finally, executing, by each piece of test equipment, a respective test sub-case to achieve cooperative linkage by means of information interaction, so as to accomplish entire process simulation of the test work conditions. The method includes the specific implementation steps as follows.

1. Analysis of Test System and Test Work Condition

Figure 1:
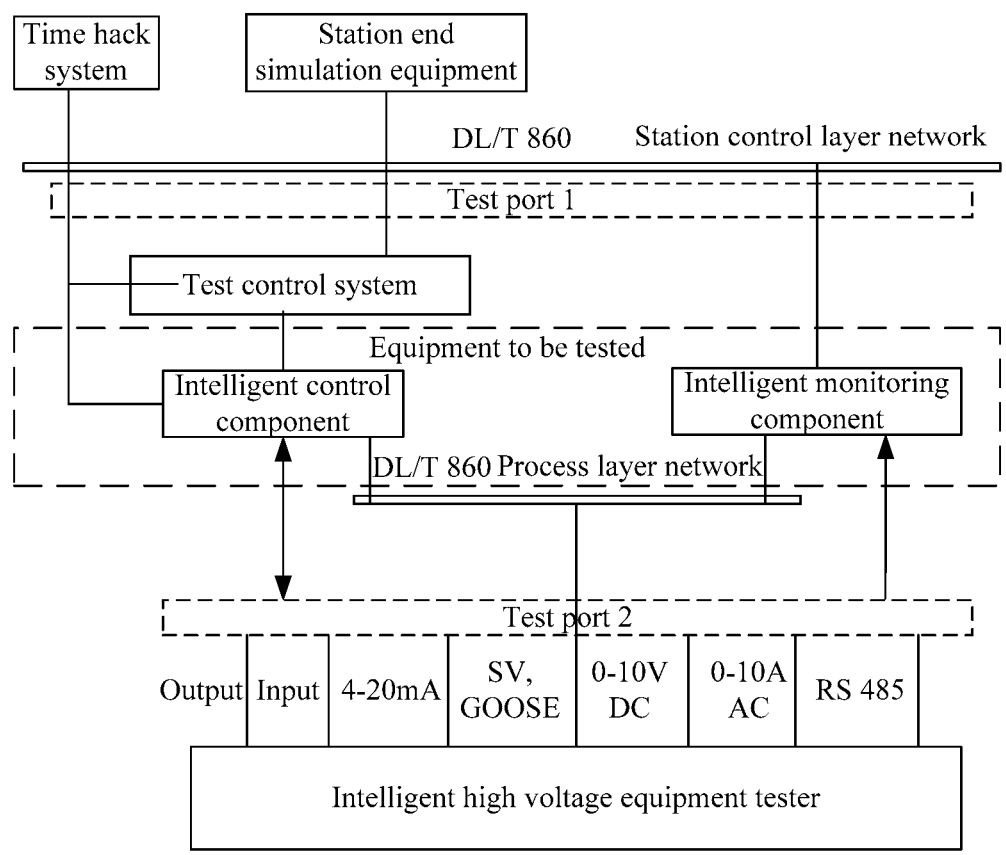
FIG. 1 is a structural diagram of a test system for intelligent high voltage equipment in the present disclosure.

In this step, by analyzing a test system and test work conditions, main tasks and basic task elements of each piece of equipment in the system are determined according to a system architecture of a test environment and test requirements. Without loss of generality, the present embodiment provides an illustration of a test system architecture of intelligent high voltage equipment. As shown in FIG. 1, according to basic application requirements of actual engineering, the system is composed of three layers, namely an uppermost layer, a middle layer and a lower layer, the uppermost layer being composed of station end simulation equipment (a background system of a station control layer of a simulation substation), a time hack device and a test control device, the middle layer being spacer layer equipment including an intelligent control component and an intelligent monitoring component, the lower layer being an intelligent high voltage equipment tester configured to simulate interfaces of various sensors installed on high voltage equipment. In an environment shown in FIG. 1, the intelligent control component and the intelligent monitoring component serving as core parts of the intelligent high voltage equipment are tested equipment, and the station end simulation equipment and the intelligent high voltage equipment tester are main test equipment, wherein a station end unit plays a role of a station end background in a test process, and is configured to receive and collect various pieces of information of subordinate equipment, so as to visualize equipment running and control states; meanwhile, the station end unit serves as a station end manual control platform, so as to issue a control command for switching operation or on-load voltage regulation and to feed back an execution process; also meanwhile, the station end unit plays a role of a judge in the test process, and evaluates the performances of the tested equipment by comparing system action feedbacks and achieving test expectations. The intelligent high voltage equipment tester plays roles of high voltage equipment and a judge, and is configured to dynamically simulate running work conditions and operation work conditions of the high voltage equipment and collect various pieces of information about the tested equipment, so as to check the accuracy of action behaviors thereof. The time hack device and the test control device are auxiliary test equipment, which provides a stable time hack data source and transfers information.

2. Unified Modeling on Test Cases to Generate General Test Case

Figure 2:
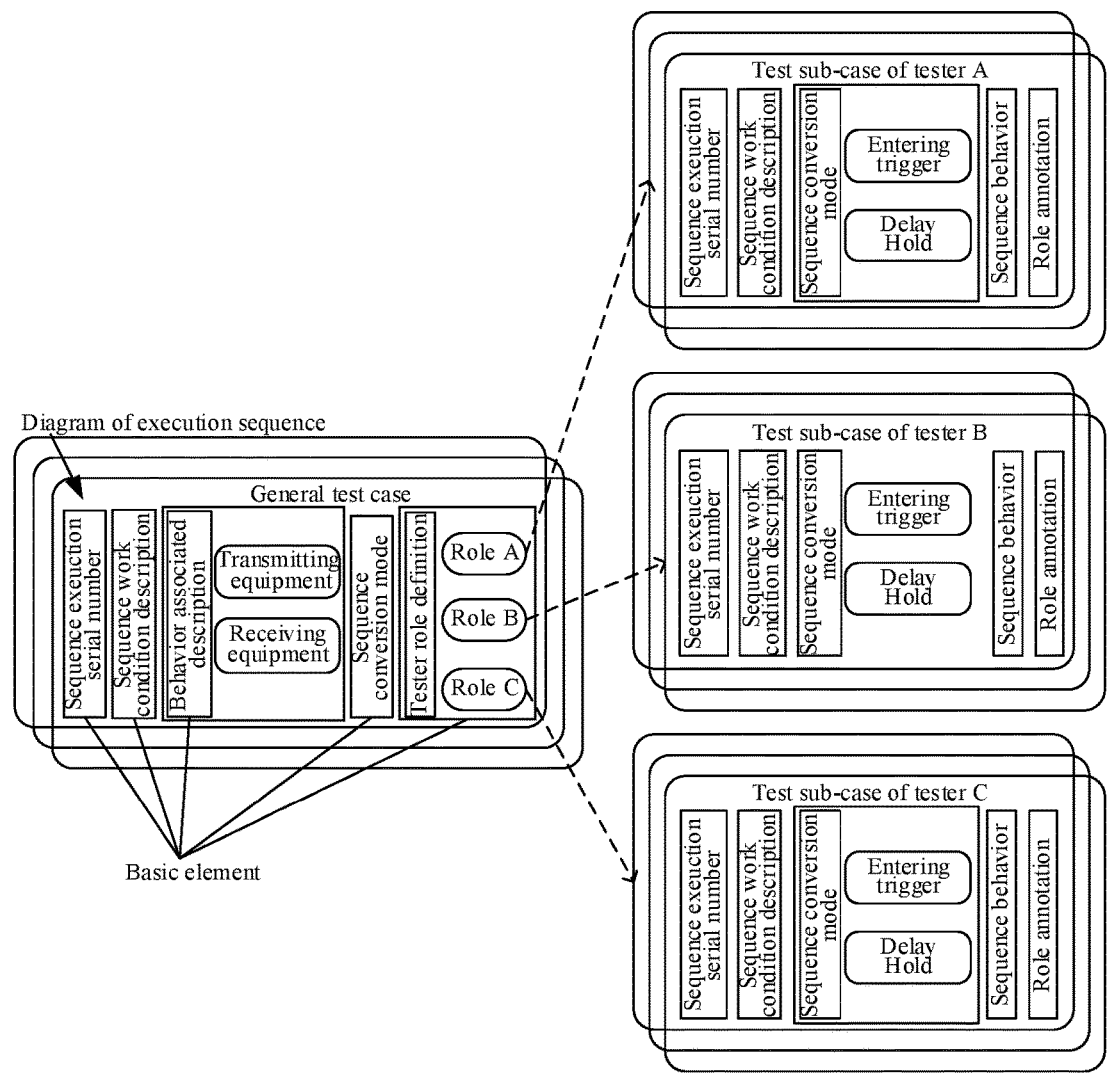
FIG. 2 is a diagram of a unified model for test cases in an embodiment of the present disclosure.

Unified modeling is carried out on test equipment behaviors according to test requirements, the test requirements are refined, test tasks are decomposed, and a general test case is generated. The general test case mainly refers to globally carrying out systematic description and normalized expression on behaviors and time sequences required by system work conditions, and it is necessary to determine corresponding action subjects in different processes of the general test case. That is, test roles are allocated for relevant testers to be played, basic elements such as a time sequence for describing a certain work condition and test work conditions are organized so as to form sequence state pages, and all sequence state pages are arranged and organized according to an execution sequence so as to form a general test case base. As shown in FIG. 2, a unified model for the test cases is provided. The model contains the basic elements such as time sequences of states, test work conditions, equipment behavior associations, sequence conversion modes and role definitions. The present embodiment provides an on-load voltage regulation system-level general test case, as shown in Table 1.

TABLE 1

| | On-load voltage regulation system-level general test case | | | | |
|---|---|---|---|---|---|
| Serial number | Work condition description | Transmitting equipment | Receiving equipment | Sequence conversion mode | Role illustration |
| 1 | Enter initial test state, and station end sends on-load voltage regulation control command | Station end simulation equipment | Intelligent high voltage equipment tester | Trigger mode: informing relevant equipment, such as intelligent high voltage equipment tester, in system of entering pre-test work conditions | Station end simulation equipment starts test |
| 2 | Simulate signals such as current voltage switch quantity in running state of | Intelligent high voltage equipment tester | Intelligent terminal | Delay mode: remaining time for 10 s | Intelligent high voltage equipment tester simulates pre-test running |

TABLE 1-continued

On-load voltage regulation system-level general test case

| Serial number | Work condition description | Transmitting equipment | Receiving equipment | Sequence conversion mode | Role illustration |
|---|---|---|---|---|---|
| | primary equipment as pre-test conditions | | | | work conditions of primary equipment |
| | Collect primary equipment running state information | Intelligent terminal | Test control device | | Tested equipment intelligent terminal collects primary equipment running information |
| | Upload primary equipment running state information | Test control device | Station end simulation equipment | | Station end simulation equipment acquires primary equipment running state information |
| 3 | Station end sends on-load voltage regulation control command | Station end simulation equipment | Test control device | Trigger mode: starting immediately while sequence 2 is up | Station end simulation equipment starts test |
| 4 | Test control device receives on-load voltage regulation control command sent by station end and then issues same to intelligent terminal | Test control device | Intelligent terminal | Trigger mode: receiving on-load voltage regulation control command sent by station end | Issue test control device information |
| 5 | Control output of intelligent control component | Intelligent control component | Intelligent high voltage equipment tester | Trigger mode: receiving on-load voltage regulation control command sent by test control device | Intelligent terminal sends on-load voltage regulation command (output) |
| 6 | Simulate feedback quantity of high voltage equipment in regulation process after collecting input information sent by intelligent terminal | Intelligent terminal | Intelligent high voltage equipment tester | Trigger mode: receiving on-load voltage regulation control command sent by intelligent terminal | Intelligent high voltage equipment tester simulates feedback quantity of high voltage equipment in regulation process, and evaluates whether action behaviors and time of intelligent terminal meet expectations |
| 7 | Read control result feedback information | Intelligent high voltage equipment tester | Intelligent control component | Delay mode: time lasts for 10 s | Intelligent terminal collects state of regulated high voltage equipment |
| | Upload control result feedback information | Intelligent control component | Test control device | | Information reaction |
| | Upload control result feedback information | Test control device | Station end simulation equipment | | Information reaction |

TABLE 1-continued

On-load voltage regulation system-level general test case

| Serial number | Work condition description | Transmitting equipment | Receiving equipment | Sequence conversion mode | Role illustration |
|---|---|---|---|---|---|
| | Evaluate this test situation, and record test result | Station end simulation equipment | Test evaluation file | | Station end simulation equipment evaluates whether action behaviors and time of intelligent terminal meet expectations |
| 8 | End test | Station end simulation equipment | Intelligent high voltage equipment tester and the like | Trigger mode: informing relevant equipment, such as intelligent high voltage equipment tester, in system of ending test | Station end simulation equipment ends test, and records report; intelligent high voltage equipment tester stops output |

3. Generation of Test Sub-Cases

According to a basic element of role definition, for each of same roles in the general test case, sequence states of the same role are extracted from the general test case, and the sequence states are recombined in sequence so as to form a test sub-case of the role. Each piece of test equipment corresponds to a role, so test sub-case (as shown in FIG. 2) corresponding to each piece of test equipment can be generated based on roles in the general test case. The test sub-cases carry out normalized description on a test state execution sequence, work condition descriptions, a sequence conversion method, sequence behaviors and role annotations of tester equipment, and can be installed in a distributed manner. According to an on-load voltage regulation system general test case shown in Table 1, implementation examples of a test sub-case of the station end simulation equipment and a test sub-case of the intelligent high voltage equipment tester can be extracted, as shown in Table 2 and Table 3. The test sub-cases are specific test steps executed by a tester, and file formats thereof shall meet running requirements of the tester equipment, may be a TZT format or a BAT format, and can be directly loaded by test equipment and called during test.

TABLE 2

Test sub-case of station end simulation equipment

| Serial number | Work condition description | Sequence conversion mode | Sequence behavior | Role annotation |
|---|---|---|---|---|
| 1 | Test preparation state | Trigger mode: manual start or sequence packet calling start | Inform, by means of message, relevant equipment, such as intelligent high voltage equipment tester, in system of entering pre-test work conditions | Station end simulation equipment starts test |
| 2 | Pre-operation state of high voltage equipment | Delay mode: time lasts for 10 s | Enter operation pre-test state, and acquire state information about high voltage equipment | Station end simulation equipment acquires operation pre-test state information about high voltage equipment |
| 3 | Station end sends on-load voltage regulation control command | Trigger mode: start test immediately when delayed time (10 s) of sequence 2 is up | Send on-load voltage regulation command to spacer layer | Station end simulation equipment outputs on-load voltage regulation command |
| 4 | Read back state of high voltage equipment, and | Delay mode: time lasts for 10 s | Acquire state of high voltage equipment, and | Station end simulation equipment reads |

TABLE 2-continued

Test sub-case of station end simulation equipment

| Serial number | Work condition description | Sequence conversion mode | Sequence behavior | Role annotation |
|---|---|---|---|---|
| | check whether operation succeeds | | check whether operation succeeds; evaluate whether action behaviors and time of intelligent terminal meet expectations; generate test evaluation file | back state of high voltage equipment, and checks whether operation succeeds |
| | Evaluate this test situation, and record test result | | | Station end simulation equipment evaluates whether action behaviors and time of intelligent terminal meet expectations |
| 5 | End test | Trigger mode: enter this state immediately when delayed time (10 s) of sequence 4 is up | Save test evaluation file | Station end simulation equipment ends this test |

TABLE 3

Test sub-case of intelligent high voltage equipment tester

| Serial number | Work condition description | Sequence conversion mode | Sequence behavior | Role annotation |
|---|---|---|---|---|
| 1 | Test waiting state | Trigger mode: entering next state after receiving test starting message sent by station end simulation equipment | Wait for beginning of system test | Intelligent high voltage equipment tester waits for test starting message of station end unit |
| 2 | Running state of primary equipment before on-load voltage regulation operation | Delay mode: time lasts for 10 s Trigger mode: entering next state immediately after receiving voltage regulation contact signal sent by intelligent terminal equipment | Output signals such as current voltage switch quantity during normal running of primary equipment to simulate before on-load voltage regulation | Intelligent high voltage equipment tester simulates running work conditions of primary equipment state before on-load voltage regulation |
| | Monitor on-load voltage regulation process | | Monitor on-load voltage regulation command sent by test control device on network | Intelligent high voltage equipment tester monitors on-load voltage regulation command sent by test control device on network |
| | | | Monitor voltage regulation action signal sent by intelligent terminal equipment | Intelligent high voltage equipment tester monitors on-load voltage regulation command sent by intelligent terminal on network |
| 3 | Change running state of primary equipment according to on-load voltage regulation command | Delay mode: time lasts for 10 s | Change running state of primary equipment according to on-load voltage regulation command. Evaluate whether action command | Intelligent high voltage equipment tester changes running state of primary equipment according to on-load voltage regulation command |

TABLE 3-continued

Test sub-case of intelligent high voltage equipment tester

| Serial number | Work condition description | Sequence conversion mode | Sequence behavior | Role annotation |
|---|---|---|---|---|
| | Evaluate this test situation, and record test result | | behaviors and time of intelligent terminal meet expectations; generate test evaluation file | Intelligent high voltage equipment tester evaluates whether action behaviors and time of intelligent terminal meet expectations |
| 4 | End test | Trigger mode: entering this state immediately when delayed time (10 s) of sequence 3 is up | Save test evaluation file and stop test output | Intelligent high voltage equipment tester ends this test |

4. Test Execution

After a test is started, each piece of tester equipment executes its respective test sub-case. When each piece of test equipment executes the test case, on one hand, an analog quantity or a switch quantity is correspondingly output according to a pre-set time sequence so as to achieve simulation of high voltage equipment work conditions and test equipment environments, and on the other hand, interaction information about tested equipment and interaction information about other testers are collected in real time, and execution of the next work condition or skipping to a relevant work condition in a test sequence is carried out according to the interaction information. Entire process simulation of the test work conditions is accomplished by means of real-time information interaction and cooperative linkage between the test equipment and the tested equipment or other pieces of test equipment.

Figure 3:
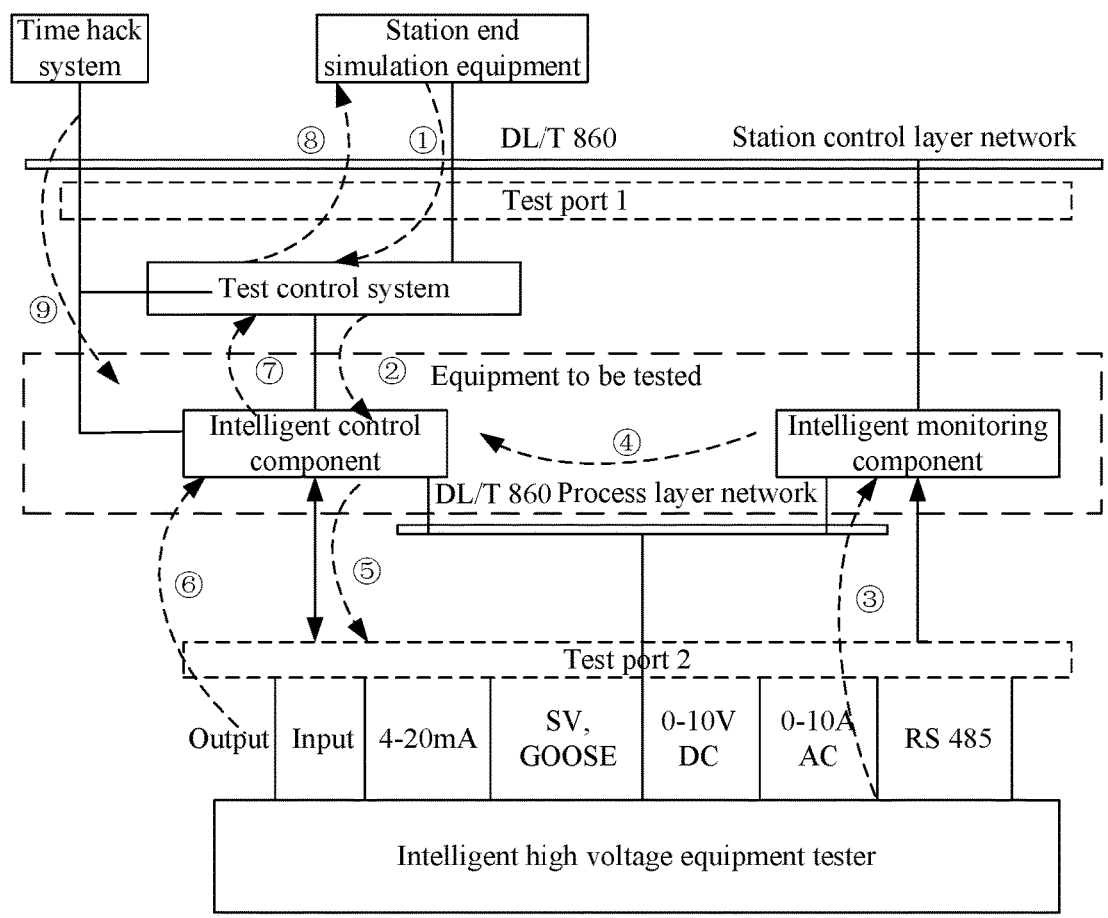
FIG. 3 is a diagram of test execution work conditions in an embodiment of the present disclosure.

FIG. 3 shows a test process of an on-load voltage regulation system in the present embodiment. (1), Station end simulation equipment sends an on-load voltage regulation control command to a test control device; (2), the test control device issues the on-load voltage regulation control command to an intelligent control component (such as an intelligent terminal); (3), (4) and (6), the intelligent control component acquires a current running state of high voltage equipment (simulated by an intelligent high voltage equipment tester); (5), the intelligent control component sends an on-load voltage regulation command to the high voltage equipment, and the high voltage equipment changes the running state according to a control requirement; (3), (4) and (6), the intelligent control component acquires a running state of the action-regulated high voltage equipment (simulated by an intelligent high voltage equipment tester); (7), the intelligent control component transmits the running state of the action-regulated high voltage equipment to the test control device; (8), the test control device transmits the running state of the action-regulated high voltage equipment to the station end simulation equipment, so as to form a complete regulation process.

The present disclosure can perform test result evaluation in the whole test process, each piece of test equipment analyzes and checks action feedback situations and data information in the test process, all pieces of test equipment co-accomplish function verification and performance detection of tested equipment, and after test evaluation is accomplished, this test is ended.

The present disclosure is described above in conjunction with examples in the drawings. However, the present disclosure is not limited to the above specific implementation. Many forms can be also made without departing from the scope protected by the purposes and claims of the present disclosure. These forms fall within the protective scope of the present disclosure.

What is claimed is:

1. A distributed test method applicable to a system-level test of intelligent high voltage equipment, comprising:
    1) carrying out unified modeling on test equipment behaviors according to test requirements, and generating a general test case;
    2) for each of same roles in the general test case, extracting basic elements associated with sequence states of the same role, and recombining the basic elements according to an execution sequence so as to form a test sub-case of the role; and
    3) upon starting of the test, executing, by each piece of test equipment, a respective test sub-case, and achieving cooperative linkage by means of information interaction, so as to automatically accomplish an overall process of test work conditions;
    wherein the general test case in Step 1) globally carries out systematic description and normalized expression on behaviors and time sequences required by system work conditions, and wherein during each of different processes of the general test case, a corresponding action subject is determined;
    wherein the unified modeling systematically ensures accuracy and coordination of test behaviors and test time sequences under various work conditions, and the basic elements contained in an established model comprise time sequences of states, test work conditions, equipment behavior associations, sequence conversion modes and role definitions.

2. The distributed test method applicable to the system-level test of the intelligent high voltage equipment of claim 1, wherein the roles are the action subjects in the different processes of the general test case, namely the test equipment.

3. The distributed test method applicable to the system-level test of the intelligent high voltage equipment of claim 2, wherein when each piece of test equipment executes the corresponding test sub-case, an analog quantity or a switch quantity is correspondingly output according to a pre-set time sequence so as to achieve simulation of high voltage equipment work conditions and test equipment environments.

4. The distributed test method applicable to the system-level test of the intelligent high voltage equipment of claim 3, wherein when each piece of test equipment executes the corresponding test sub-case, output information about tested equipment and interaction information about other testers are collected in real time, and execution of a next work condition or skipping to a relevant work condition in a test sequence is carried out according to the interaction information.

5. The distributed test method applicable to the system-level test of the intelligent high voltage equipment of claim 1, further comprising: collecting, analyzing and evaluating, by each piece of test equipment, action feedback and data information during the test, so as to automatically accomplish function verification and performance detection of the tested equipment.

6. The distributed test method applicable to the system-level test of the intelligent high voltage equipment of claim 2, further comprising: collecting, analyzing and evaluating, by each piece of test equipment, action feedback and data information during the test, so as to automatically accomplish function verification and performance detection of the tested equipment.

7. The distributed test method applicable to the system-level test of the intelligent high voltage equipment of claim 3, further comprising: collecting, analyzing and evaluating, by each piece of test equipment, action feedback and data information during the test, so as to automatically accomplish function verification and performance detection of the tested equipment.

8. The distributed test method applicable to the system-level test of the intelligent high voltage equipment of claim 4, further comprising: collecting, analyzing and evaluating, by each piece of test equipment, action feedback and data information during the test, so as to automatically accomplish function verification and performance detection of the tested equipment.

* * * * *